US008717082B2

(12) United States Patent
Deisch

(10) Patent No.: US 8,717,082 B2
(45) Date of Patent: May 6, 2014

(54) PULSE WIDTH ANTICIPATOR

(75) Inventor: Cecil W. Deisch, Warrenville, IL (US)

(73) Assignee: Tellabs Operations, Inc., Naperville, IL (US)

( * ) Notice: Subject to any disclaimer, the term of this patent is extended or adjusted under 35 U.S.C. 154(b) by 0 days.

(21) Appl. No.: 13/540,312

(22) Filed: Jul. 2, 2012

(65) Prior Publication Data

US 2014/0002138 A1    Jan. 2, 2014

(51) Int. Cl.
G06F 1/04    (2006.01)

(52) U.S. Cl.
USPC .......................................... 327/291

(58) Field of Classification Search
CPC ................ G06F 1/10; G06F 1/04; F06F 1/08
USPC .......................................... 327/291
See application file for complete search history.

(56) References Cited

U.S. PATENT DOCUMENTS 7,061,296 B2 *    6/2006    Friedrich et al. .............. 327/299

* cited by examiner

Primary Examiner — Daniel Rojas
(74) Attorney, Agent, or Firm — Fitzpatrick, Cella, Harper & Scinto

(57) ABSTRACT

An electrical circuit and a procedure for tracking at least one input pulse width applied to the electrical circuit. The electrical circuit includes a threshold component (e.g., a comparator) arranged to provide an output pulse width based on whether an input to the threshold component exceeds a threshold. The circuit also includes a controller arranged to control the threshold of the threshold component, based on the at least one input pulse width applied to the electrical circuit, such that the output pulse width of the threshold component tracks the at least one input pulse width applied to the electrical circuit. The controller includes at least a switch, and the output pulse width tracks the at least one input pulse width by following or anticipating the pulse width. In one example embodiment the tracking is performed for a series of pulses of varied widths.

22 Claims, 6 Drawing Sheets

201

US 8,717,082 B2

PULSE WIDTH ANTICIPATOR

BACKGROUND

1. Field

Example aspects described herein relate generally to integrated circuits, and, in particular, to methods, apparatuses and systems that can follow and/or anticipate a provided voltage pulse width.

2. Description of the Related Art

FIG. 1 represents a prior art circuit in which a resistor R is connected between one terminal of a switch 101 and a voltage source Vcc, and another terminal of the switch 101 is connected to ground. Operation of the switch 101 can cause generation of a voltage pulse train (PT) at node N1.

Typically, the generated pulse train (PT) has essentially equal time periods, but the widths of the individual pulses can vary. In general, the pulse widths often change very little from cycle to cycle, perhaps a small fraction of 1%, but over a long amount of time they can change substantially. The change in pulse width might be the result of 60 Hz modulating the pulse width of a much higher sampling frequency (e.g., 100 kHz).

SUMMARY

According to example aspects herein, an electrical circuit and a procedure are provided for tracking at least one input pulse width applied to the electrical circuit.

According to one example embodiment herein, the electrical circuit includes a threshold component arranged to provide an output pulse width based on whether an input to the threshold component exceeds a threshold. The circuit also includes a controller arranged to control the threshold of the threshold component, based on at least one input pulse width applied to the electrical circuit, such that the output pulse width of the threshold component tracks the at least one input pulse width applied to the electrical circuit.

In accordance with one example embodiment herein, the threshold component includes a comparator, and the controller includes both a storage element arranged to store charge upon which the threshold is based, and a switch arranged to charge or discharge the storage element based on the at least one input pulse width applied to the electrical circuit.

In accordance with a further example embodiment herein, the controller further includes at least one logic element arranged to control the switch based on the at least one input pulse width applied to the electrical circuit, and the at least one input pulse width is applied to the electrical circuit by another switch.

According to an example aspect herein, the output pulse width of the threshold component tracks the at least one input pulse width by following and/or anticipating a low-going end of the at least one input pulse width.

In still a further example embodiment herein, the electrical circuit further comprises a further threshold component arranged to provide a further output pulse width based on whether an input to the further threshold component exceeds a further threshold. In this example, the controller also is arranged to control the further threshold of the further threshold component, based on the at least one input pulse width applied to the electrical circuit, such that the further output pulse width of the further threshold component tracks the at least one input pulse width applied to the electrical circuit. The further output pulse width of the further threshold component tracks the at least one input pulse width by anticipating a low-going end of the at least one input pulse width, in one example.

In still a further example embodiment herein, the circuit further comprises at least one voltage divider coupled between a voltage source and the storage element, and arranged to set the threshold based on an amount of charge stored in the storage element.

The at least one input pulse width may include a plurality of varying input pulse widths, and, in one example embodiment herein, the output pulse width of the threshold component tracks at least one of the input pulse widths having a minimum pulse width.

The circuit herein can be useful when used in a specialized AC PWM (pulse-width modulator).

BRIEF DESCRIPTION OF THE DRAWINGS

The teachings claimed and/or described are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 4a shows a voltage Vc1 of a capacitor 121, a voltage V+ on a positive (+) input of a comparator 131, and a voltage Vc2 of a capacitor 122 of the circuit of FIG. 2, over a cycle.

FIG. 4b shows an example of an on-off cycle of a switch 102 of the circuit of FIG. 2, over the cycle of FIG. 4a, wherein each pulse shown in FIG. 4b represents a time period in which the switch 102 is closed.

FIG. 4c shows an output U1 of comparator 131 of the circuit of FIG. 2, and a voltage 101a across a switch 101' of the circuit of FIG. 2, over the cycle of FIG. 4a.

FIG. 4d shows a representation of a current I1 which discharges a capacitor 122 through a resistor 117 and a switch 103 of the circuit of FIG. 2, over the cycle of FIG. 4a.

FIG. 5a shows a voltage Vc1 of a capacitor 121, a voltage V+ on a positive (+) input of a comparator 131, and a voltage Vc2 of a capacitor 122 of the circuit of FIG. 2, over a cycle.

FIG. 5b shows an example of an on-off cycle of a switch 102 of the circuit of FIG. 2, over the cycle of FIG. 5a, wherein each pulse shown in FIG. 5b represents a time period in which the switch 102 is closed.

FIG. 5c shows an output U1 of comparator 131 of the circuit of FIG. 2, and a voltage 101a across a switch 101' of the circuit of FIG. 2, over the cycle of FIG. 5a.

FIG. 5d shows a representation of a current I1 which discharges a capacitor 122 through a resistor 117 and a switch 103 of the circuit of FIG. 2, over the cycle of FIG. 5a.

FIG. 6a shows a voltage Vc1 of a capacitor 121, a voltage V+ on a positive (+) input of a comparator 131, a voltage V2+ on a positive (+) input of a comparator 137, and a voltage Vc2 of a capacitor 122 of the circuit of FIG. 3, over a cycle.

FIG. 6b shows an example of an on-off cycle of a switch 102 of the circuit of FIG. 3, over the cycle of FIG. 6a, wherein each pulse shown in FIG. 6b represents a time period in which the switch 102 is closed.

FIG. 6c shows an output U1 of comparator 131 of the circuit of FIG. 3, an output U2 of comparator 137 of the circuit of FIG. 3, and a voltage 101a across a switch 101' of the circuit of FIG. 3, over the cycle of FIG. 6a.

FIG. 6d shows a representation of a current I1 which discharges a capacitor 122 through a resistor 117 and a switch 103 of the circuit of FIG. 3, over the cycle of FIG. 6a.

It should be noted that different ones of the Figures may include the same reference numerals to identify the same components, and thus a description of each such component may not be provided herein with respect to each particular Figure.

DETAILED DESCRIPTION

In accordance with an example aspect herein, methods, apparatuses, and systems are provided that can follow and/or anticipate a provided voltage pulse.

Figure 2:
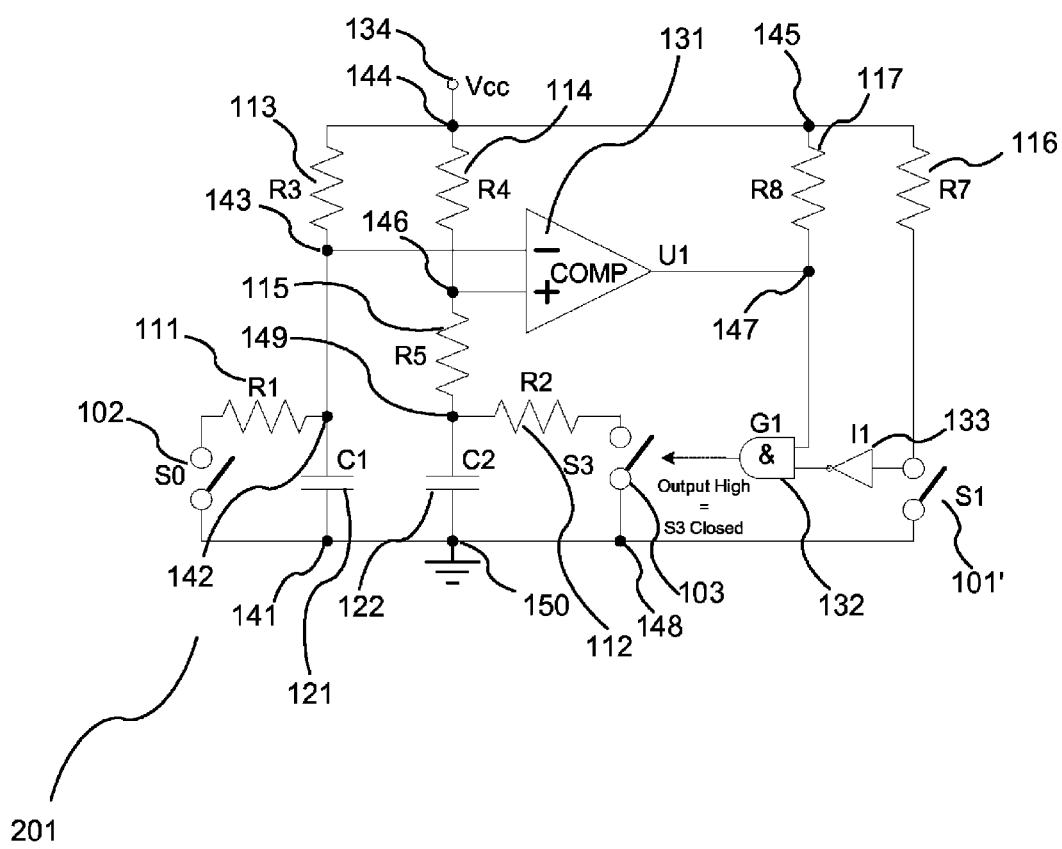
FIG. 2 shows a circuit that can follow a provided input pulse width, according to an example embodiment herein.

FIG. 2 shows a circuit 201 according to an example embodiment herein. The circuit 201 can follow a next pulse width of a switch 101' by switching low slightly after the ending of a pulse width generated by the switch 101'. Circuit 201 comprises switches 101', 102 and 103, resistors 111, 112, 113, 114, 115, 116, and 117, storage elements such as capacitors 121 and 122, a threshold component such as a comparator 131, AND gate 132, an inverter 133, and a positive-supply voltage source 134. At least one of the elements 122, 112, 103, 132, and 133 forms a controller.

Figure 1:
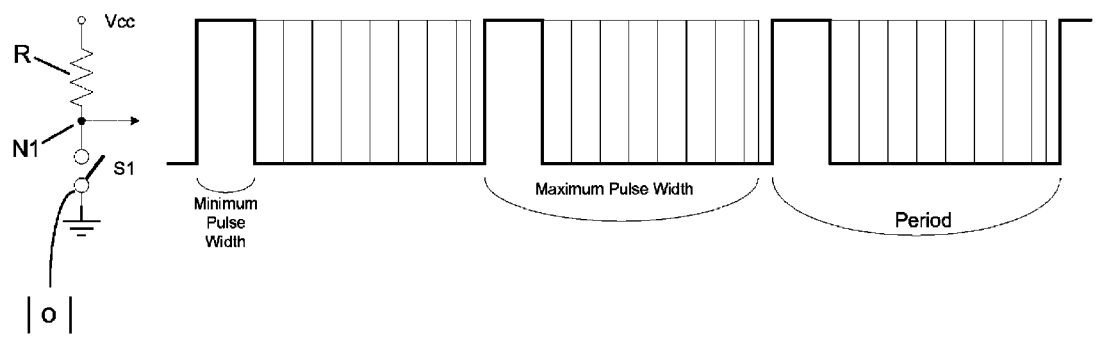
FIG. 1 represents a prior art circuit in which operation of a switch can cause generation of a voltage pulse train.

Switch 101' represents the driver of a pulse train with varying pulse widths, such as the pulse train (PT) of FIG. 1. In an example embodiment herein, switch 101' is controlled by an external control source, and the pulse width therefore is so controlled as well, and may or may not be known within the system of circuit 201. The switch 101' operates by opening when the pulse is high. When switch 101' closes (at some time within the pulse period), the pulse goes low, signaling the pulse width. Switch 102 also is controlled by an external control source, and the pulse width therefore may or may not be known within the system of circuit 201.

Resistor 111 is interposed between one terminal of switch 102 and a node 142, and capacitor 121 is coupled between nodes 141 and 142. Both of the resistors 113 and 114 are connected at one end thereof to a node 144, which is connected to voltage source 134. Another end of resistor 113 is connected to node 143, and the other end of resistor 114 is connected to a node 146. A negative (−) input of the comparator 131 is connected to node 143, and a positive (+) input of the comparator 131 is connected to node 146. The comparator 131 also has an output connected to a node 147. The comparator 131 operates such that, when non-inverting positive (+) input is at a higher voltage than the inverting, negative (−) input, the comparator 131 outputs a positive voltage. When a voltage at the positive (+) input drops below a voltage at the negative (−) input, then the comparator 131 outputs a negative voltage.

Referring again to node 146, that node is connected to one end of resistor 115, and another end of that resistor 115 is connected to node 149. The resistors 114 and 115 form a voltage divider on the positive (+) input of the comparator 131. Capacitor 122 is coupled between nodes 149 and 150 and resistor 112 is coupled between node 149 and one terminal of switch 103. Another terminal of that switch 103 is connected to node 148. The capacitor 122 preferably is large enough such that its voltage does not change much from cycle to cycle of the pulse train.

Referring to resistor 117, that resistor 117 is connected between nodes 145 and 147, and node 147 is connected to a first input of the AND gate 132. Resistor 116 is connected between node 145 and a first terminal of switch 101'. Each of the nodes 141, 148, and 150 is connected to ground. Although for convenience those nodes are shown as being separate, in actuality they may form a same, single node. Inverter 133 is connected between the first terminal of switch 101' and a second input of the AND gate 132, and a second terminal of the switch 101' is connected to node 148. An output of the AND gate 132 controls the switch 103.

The manner in which the AND gate 132 controls the switch 103 will now be described. The gate 132 provides a high output when both of its inputs receive a high input (and when the inverter 133 provides a high output in response to a low input being applied to its input when switch 101' is closed). A high output from the gate 132 causes the switch 103 to become closed. On the other hand, when one input of AND gate 132 is low and another input of AND gate 132 is high, the gate 132 provides a low output, which results in switch 103 being open. In other example embodiments, the logic functions performed by the inverter 133 and AND gate 132 are accomplished using other logic devices besides those devices.

The manner in which the overall circuit 201 operates will now be described. Prior to reaching steady-state, the circuit 201 functions as follows. At the end of each pulse period, switch 102 momentarily closes to quickly discharge capacitor 121. Initially, assume that capacitor 122 is fully discharged such that its voltage is zero. Resistors 114 and 115 form a voltage divider on the positive (+) input of comparator 131, and since the initial voltage on capacitor 121 is zero, the output U1 of comparator 131 is high because its positive (+) input voltage is greater than zero.

When switch 102 opens, it remains open for the entire duration of the pulse period, and resistor 113 charges capacitor 121 during that time. As capacitor 121 charges up, its voltage will eventually (i.e., sometime within the pulse period) rise to be equal to or exceed the voltage on the positive (+) input, and the output U1 of comparator 131 will go low as a result.

So long as the voltage on capacitor 122 is kept at ground, the pulse width of output U1 of comparator 131 will remain constant over all subsequent cycles.

Now assume that the voltage on capacitor 122 is increased (e.g., manually). This increase causes the voltage at the positive (+) input of comparator 131 to increase, and thus, in such a case, it will take somewhat longer time for the voltage on capacitor 121 to reach this threshold and hence the output U1 of comparator 131 will have a longer pulse width.

In the pre-steady-state, in a first part of the pulse cycle, output U1 of comparator 131 is high and switch 101' is open so its voltage also is high. Under this condition, the second input of AND gate 132 is low (owing to inverter 133) so the output of AND gate 132 also is low, and, as a result, switch 103 remains open. Next, assuming that, as time progresses within the pulse cycle, the output U1 of comparator 131 goes low before switch 101' closes. As soon as output U1 goes low, the AND gate 132 is locked low even when switch 101' eventually goes low during this pulse cycle and switch 103 remains open throughout this particular pulse cycle.

Since switch 103 did not close during this example pulse cycle, resistors 114 and 115 slightly charge capacitor 122, giving a small increase in the voltage at the positive (+) input of comparator 131. This results in a slight increase in the pulse width of the comparator output U1. Thus, if the next pulse cycle still has the output U1 going low before switch 101' goes low, then, again the voltage on capacitor 122 slightly increases. This process repeats itself until the voltage on capacitor 122 rises high enough such that the pulse widths of output U1 of the comparator 131 and switch 101' are identical. When that occurs, operation of the circuit 201 has reached the edge of being in steady-state.

Figure 4:
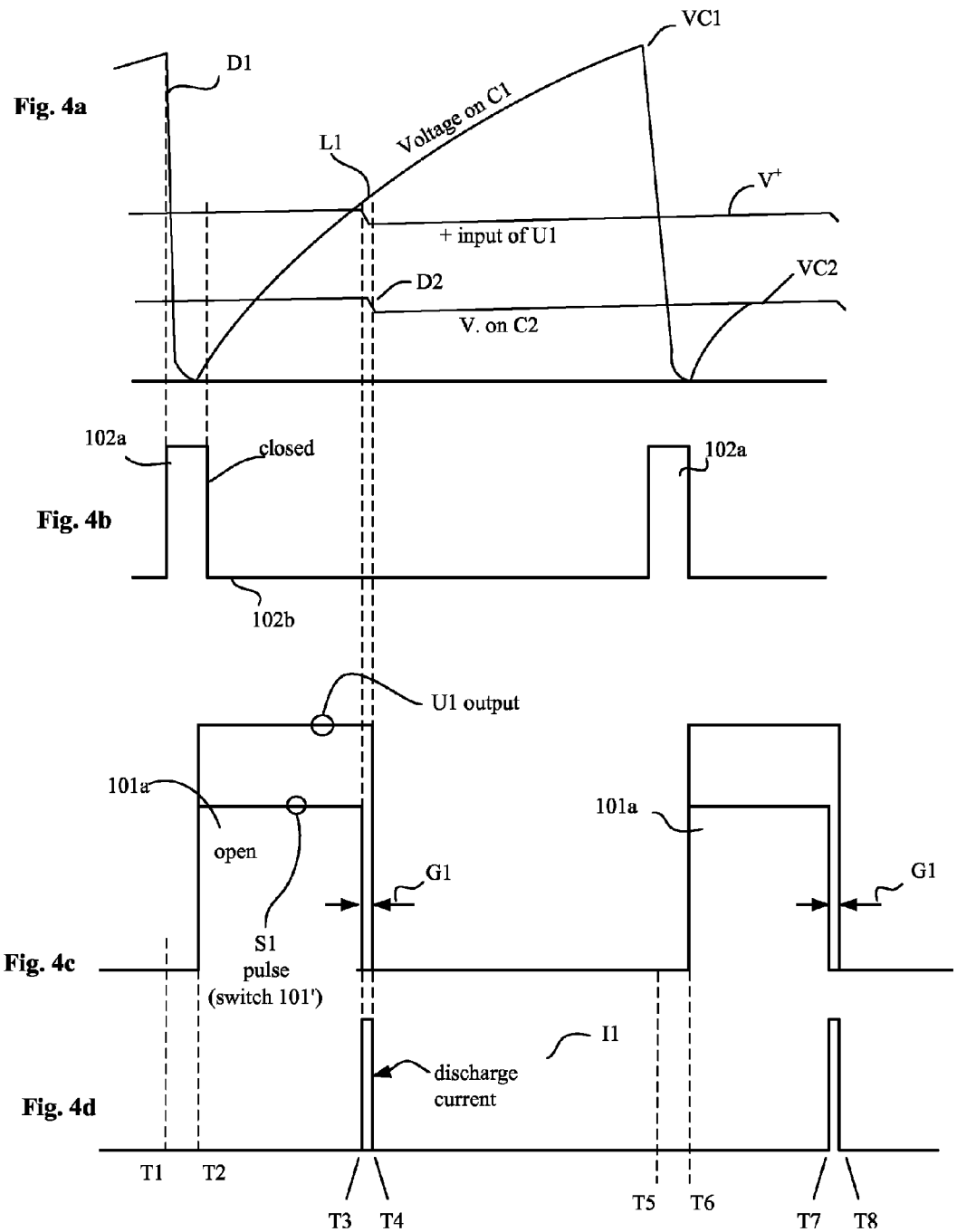
FIG. 4 comprises FIGS. 4a to 4d, and represents example waveforms and switching cycles for components of the circuit of FIG. 2 for a case in which the provided input pulse width is narrow.
Figure 5:
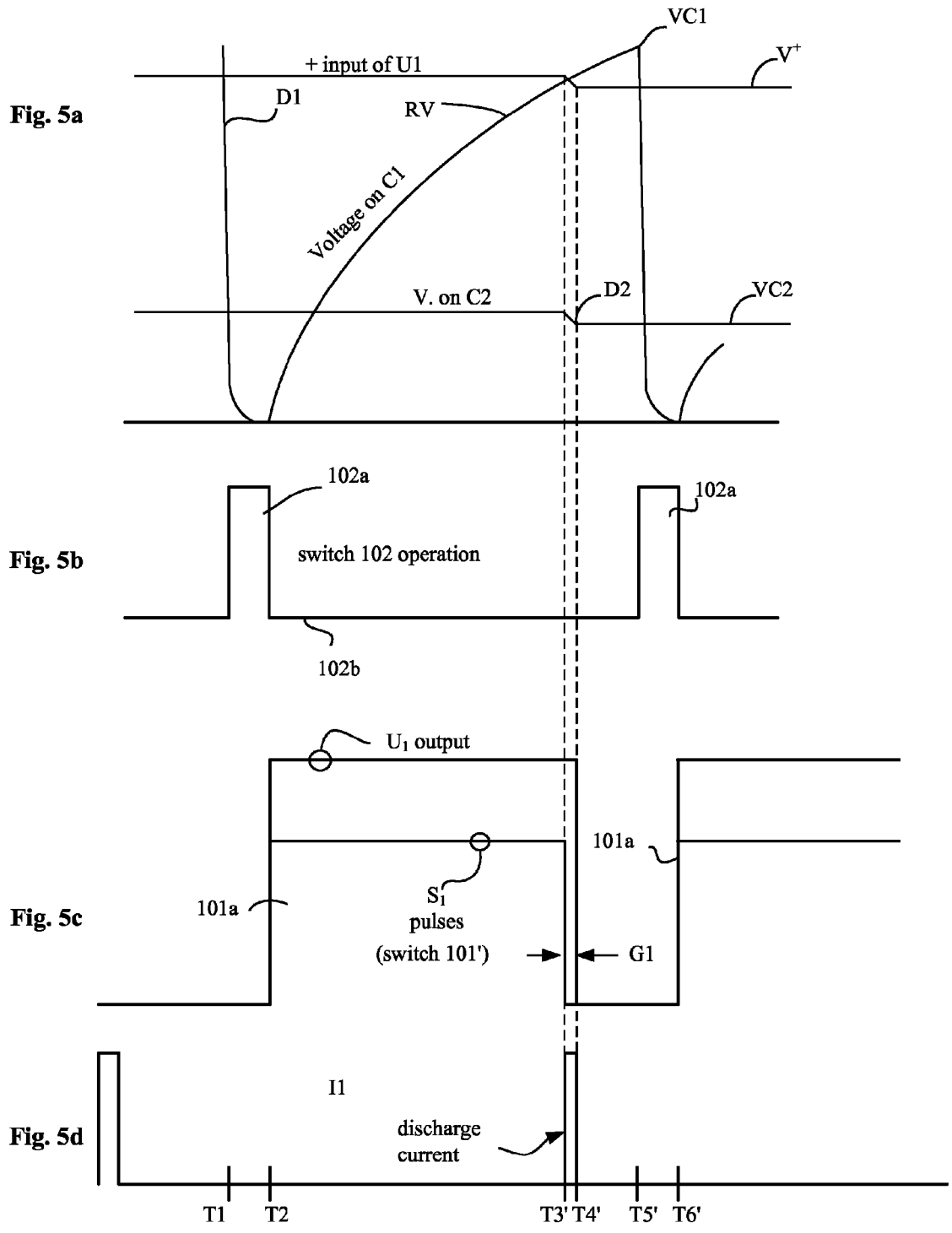
FIG. 5 comprises FIGS. 5a to 5d, and represents example waveforms and switching cycles for components of the circuit of FIG. 2 for a case in which the provided input pulse width is wide.

Referring now to FIG. 4 in conjunction with FIG. 2, operation of the circuit 201 for subsequent pulses will now be described, according to an example aspect herein. As can be appreciated in view of FIGS. 4a and 4b, at the start (time T1) of each cycle switch 102 momentarily closes to completely discharge the voltage of capacitor 121. For example, FIG. 4b shows a representation (in the form of a pulse, for convenience) 102a of the switch 102 closing at time T1, and FIG. 4a shows a corresponding drop D1 of the voltage Vc1 of capacitor 121 representing the discharge starting at time T1, wherein the capacitor 121 discharges through the resistor 111 and switch 102 until time T2.

After the short closure 102a (FIG. 4b) of switch 102 between times T1 and T2, the switch 102 opens at time T2, and switch 101' opens at time T2 as well (wherein when open the switch 101' has a voltage pulse 101a across it, represented in FIG. 4c). The opening of the switch 101' causes the voltage on resistor 116 to become positive. Also at time T2 when switch 102 opens, the voltage Vc1 on capacitor 121 begins to charge positive because of the current through resistor 113.

Switch 102, upon opening at the beginning of each pulse period (e.g., at time T2), remains open (e.g., 102b) for the entire duration of the pulse period (FIG. 4b) while resistor 113 charges capacitor 121 for providing a rising voltage starting at time T2. Voltage Vc2 of capacitor 122 also is shown in FIG. 4a, as is a voltage V+ at the positive (+) input to comparator 131. That latter voltage V+ is greater than voltage Vc1 of capacitor 121 between times T2 to T4.

At time T3 the switch 101' closes, which causes a low input to be provided to the inverter 133 and a resultant high output to be provided from the inverter 133 to the second input of AND gate 132. Because at time T3 the output U1 from the comparator 131 also is high, the input provided to the first input of AND gate 132 also is high. Thus, with both its inputs being high, the gate 132 outputs a high to cause closing of the switch 103. Closing of the switch 103 results in a slight discharging (D2) (FIG. 4a) of capacitor 122. FIG. 4d shows discharge current (I1) that passes through resistor 112 and switch 103 as a result of such discharging.

The capacitor 121's voltage Vc1, which began rising at time T2, eventually rises such that, at a time T4 occurring momentarily after time T3 when capacitor 122 begins discharging, the voltage Vc1 becomes equal to (and then exceeds, until later in the cycle) the voltage V+ on the positive (+) input terminal of the comparator 131, as represented by L1 in FIG. 4a, and, as a result, the output of the comparator 131 goes low at that time T4 (FIG. 4c).

During a small interval (G1) between when the voltage on switch 101' goes low at time T3 and the time T4 when the output of comparator 131 goes low, the inverter 133 and the logic AND gate 132 cause switch 103 to momentarily close as described above, which results in a slight discharging (D2) (FIG. 4a) of capacitor 122 through resistor 112 and switch 103 (FIG. 4d). Eventually, the time during which switch 103 is closed grows large enough and reaches stability such that the amount of charge deposited on capacitor 122 during the first part of the pulse cycle becomes removed again during the short time interval when the switch 103 is in a closed position.

If the value of resistor 112 is small, it does not take much of a pulse overlap for switch 103 to remove substantial charge from capacitor 122, so the overlap can be made quite small as compared to the pulse cycle. For this situation the output U1 of comparator 131 goes low slightly after the voltage of switch 101' goes low.

The circuit 201 reaches steady-state when the charge deposited into capacitor 122 from resistors 114 and 115 during the cycle exactly equals the charge removed during the narrow discharge of switch 103 closing. When the circuit 201 reaches steady-state, the voltage on capacitor 122 is nearly constant from cycle-to-cycle because capacitor 122, in one example, is chosen to be large enough such that it has a long-term memory (compared to several cycles of the switch 101' waveforms). The larger the capacitor 122 is, the more it tends to reach a stable state based on the shortest of many pulse cycles. Through a voltage divider formed by resistors 114 and 115, the voltage on capacitor 122 determines the higher voltage on the positive (+) input of comparator 131.

In example embodiments such as those in which it may be desired to remember the shortest pulse in a long, but slowly repeating, ensemble of varying pulse widths of pulses at switch 101', capacitor 122 can be selected to be very large.

At time T5 the cycle repeats again through times T5 to beyond T8, where operations like those that occurred from time T1 up to just before time T5 occur again, etc.

FIGS. 5a-5d show the relevant waveforms when the pulse widths of switch 101' are relatively long. The circuit 201 functions exactly the same way as described above in the case where the pulse widths are relatively narrow, except that now the steady-state voltage Vc2 of capacitor 122 is higher owing to the switch 103 being closed for a slightly longer period of time (owing to the longer pulse widths 101a (FIG. 5c) which give a larger total charge into capacitor C122) relative to that in the case of narrower pulse widths, and hence, the voltage V+ (FIG. 5a) on the positive (+) input of comparator 131 also is higher in this case as well.

Since the voltage V+ on the positive (+) input of comparator 131 is higher (FIG. 5a), it takes longer for the voltage Vc1 on capacitor 121 (FIG. 5a) to build up to this higher voltage V+ and hence the pulse widths of the output U1 of comparator 131 are wider (i.e., between times T2 and T4' in FIG. 5c) relative to those in FIG. 4c, for example.

Again, for the case of wide pulse widths, the circuit 201 reaches steady-state when the input charge to capacitor 122 from resistors 114 and 115 during the cycle exactly equals the charge removed during the large but narrow discharge that results from switch 103 closing.

As can be appreciated in view of the above description, the circuit 201 is able to reliably and accurately follow the slowly changing input pulse widths of switch 101', with only slight delay, owing to the output U1 of comparator 131 following the pulse of switch 101' with only slight delay, as represented in FIGS. 4c and 5c. The circuit 201 does this by having the output U1 of comparator 131 pulse low slightly after the switch 101' pulse goes low.

In addition to the circuit 201, the inventor also has discovered that, by having accurate placement of the timing of the output of a comparator, the above circuit 201 can be modified so as to enable it to anticipate the next pulse width and produce a pulse which goes low slightly before the input pulse width of switch 101'. In accordance with an example aspect herein, and referring now to FIG. 3, the inventor has discovered that this can be accomplished by adding one or more additional comparators to the above-described circuit of FIG. 2, and by subdividing resistor 115 and biasing the positive (+) input voltage of the added comparator(s) below that of the positive (+) input of comparator 131, as will be described below. In such a modified circuit, it takes less time for the voltage on capacitor 122 to reach the threshold of the added comparator(s) and hence the output of the added comparator (s) can be made to go low before the pulse from switch 101' goes low. Therefore the output of the added comparator(s) can provide a low-going pulse which accurately "anticipates" the low-going pulse from switch 101'.

Figure 3:
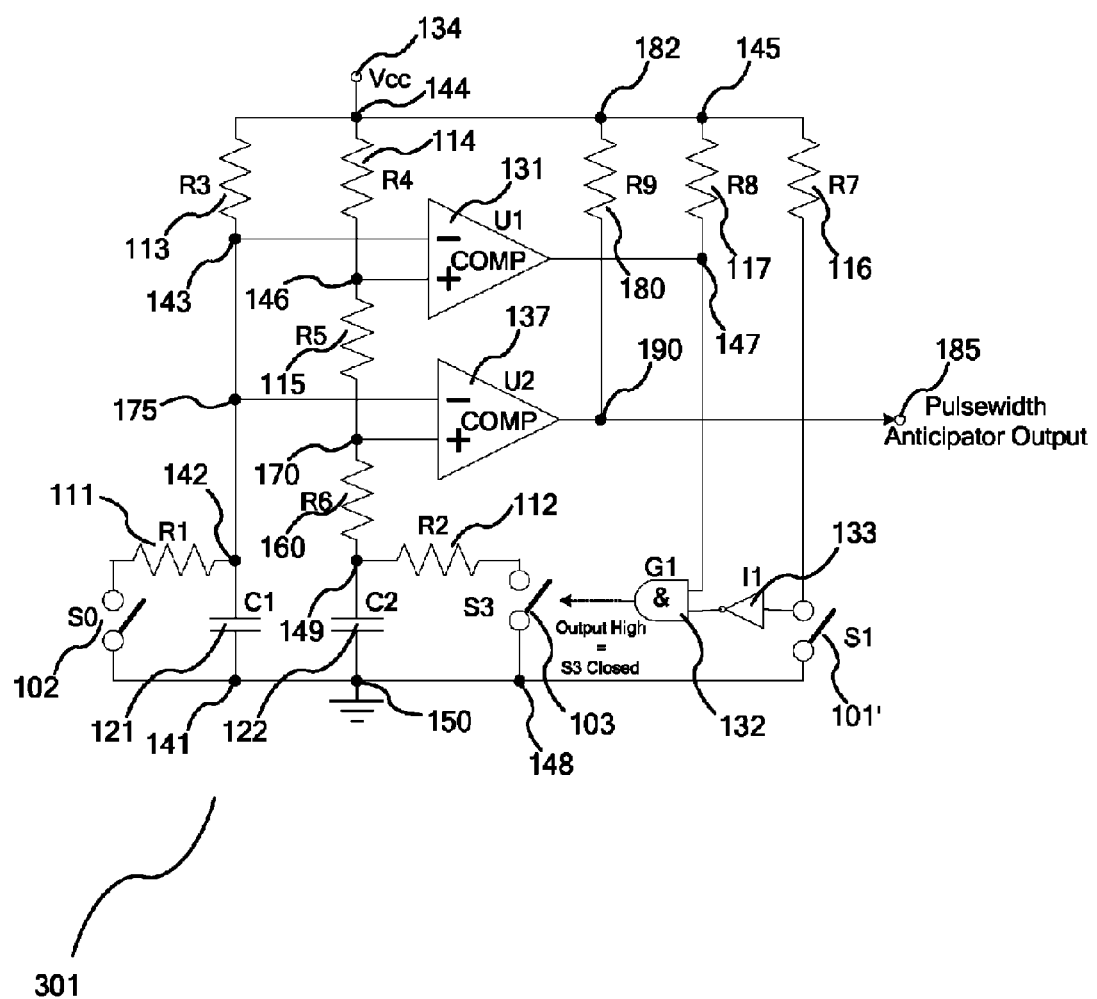
FIG. 3 shows a circuit that can anticipate a pulse width, according to another example embodiment herein.

Referring now to FIG. 3, a circuit 301 according to this example embodiment will now be described. Circuit 301 comprises the same components as the circuit 201 of FIG. 2, but also comprises an additional threshold component such as a comparator 137 having a negative (−) input coupled to node 175, wherein node 175 is connected between nodes 142 and 143. Comparator 137 also has a positive (+) input coupled to a node 170, and the resistor 115 is connected between nodes 146 and 170. The circuit 301 also includes a resistor 160 connected between nodes 149 and 170, and a resistor 180 connected between a node 182 and a node 190, wherein node 182 is connected to voltage source 134, and node 190 is connected to the output of the comparator 137. The comparator 137 operates in a similar manner as comparator 131 described above. The circuit 301 has an output 185 connected to the node 190, through which an output U2 of the comparator 137 is provided to indicate a pulsewidth.

Figure 6:
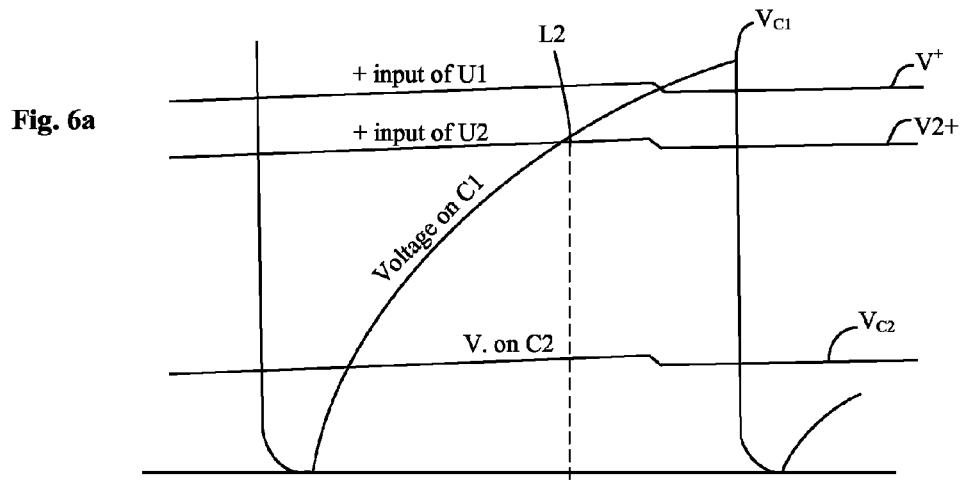
FIG. 6 comprises FIGS. 6a to 6d, and represents example waveforms and switching cycles for components of the circuit of FIG. 3 for an example case in which the provided input pulse width is wide.
Figure 6:
Figure 6:
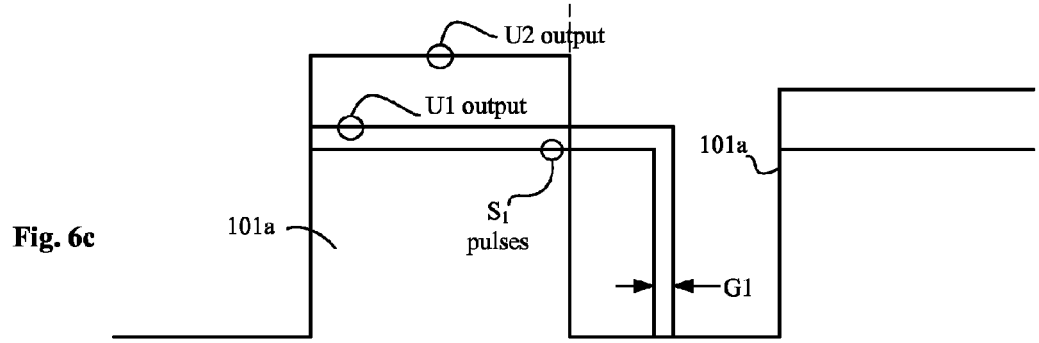
Figure 6:
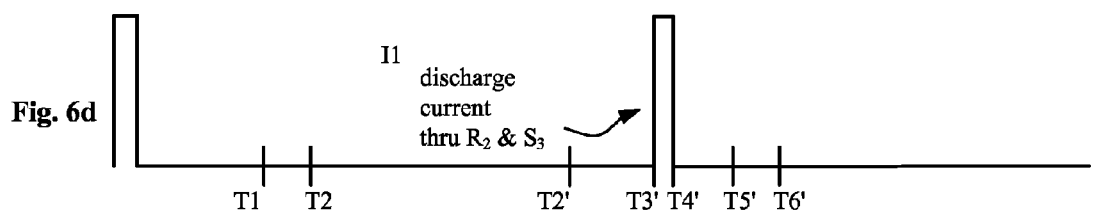

In the circuit 301, the comparator 131 output U1 goes low slightly after switch 101' closed, as described above for the case of circuit 201. In the circuit 301, however, because the positive (+) input of comparator 137 is biased at a lower voltage than the positive (+) input of comparator 131, it takes the voltage Vc1 of capacitor 121 slightly less time to reach the threshold of comparator 137 as compared to reach the threshold for comparator 131, and thus, as a result, the width of output pulse U2 of comparator 137 is shorter than that of output pulse U1 of comparator 131, and output U2 goes low prior to the pulse 101a of switch 101' going low. This can be seen in FIG. 6, for example, wherein output U2 is shown going low at time T2', before time T3' when pulse 101a of switch 101' goes low (FIG. 6c). Also shown is a voltage V2+ representing the voltage at the positive (+) input of comparator 137 over a cycle (FIG. 6a), as well as a representation L2 (FIG. 6a) of when voltage Vc1 of capacitor 122 becomes equal to that voltage V2+ on the positive (+) input terminal of the comparator 137 to cause the output U2 of comparator 137 to go low at time T2' (FIG. 6c). The remaining elements represented in FIG. 6 are the same as those in FIG. 5. (Although an example of a case in which a narrow pulse width is applied to circuit 301 by way of switch 101' is not represented in the Figures, it will be appreciated by one skilled in the art in view of this description that even in such a case the output U2 would go low prior to pulse 101a going low, although the pulses would be narrower than those shown in FIG. 6.)

Thus, in circuit 301, the output U1 from comparator 131 follows the low-going pulse 101a of switch 101', and the output U2 of the comparator 137 anticipates that low-going pulse 101a.

In one example embodiment, the bias voltage set by the ratio of resistors 115 and 160 can be set such that the output U2 of comparator 137 always properly anticipates the next pulse width and goes low slightly before the input pulse of switch 101' goes low. This can be set even to account for any inherent delays of the circuit elements.

As for the case of circuit 201 described above, in circuit 301 of FIG. 3 capacitor 122 preferably is large enough such that it has a memory of at least several (perhaps tens or hundreds of) pulse widths. Thus its steady-state voltage does not change much from cycle-to-cycle. In another example embodiment, the capacitor 122 of FIG. 3 is substantially larger than that in the case of circuit 201 of FIG. 2, such that it deliberately does not fully keep up with the changing pulse widths of switch 101'. For example, in an example situation in which the pulse widths of switch 101' vary (over several 100s or 1000s of pulses), a repeating pattern may be present. That is, when the pulse widths are at a minimum, then over many thousands of cycles they widen and then narrow back to the minimum, only to repeat this long pattern over and over again. The repeating pattern is referred to herein for convenience as "period Tx". If the value of capacitor 122 is very large and the resistors 114 and 115 are also large, then capacitor 122 has such a long term memory that its voltage does not change much over period Tx. In one example embodiment herein, capacitor 122 may have a capacitance of 20 microfarads, and the sum of the resistances of resistors 114 and 115 is 100 kilohms. In other words, the RC time constant is very long compared to Tx. Also, the resistance of resistor 112 is small, in one example embodiment. (Of course, these foregoing examples are not exclusive, and the scope of the invention is not limited only thereto.)

With the above conditions, the capacitor 122 remembers at least the minimum pulse width of switch 101' for each of the Tx periods. Upon learning the shortest pulse width, the circuit 301 will continue outputting an indication of a narrow pulse even though the input pulses continue to vary widely. During times when the pulse widths are greater than the minimum, switch 103 does not close and the voltage on capacitor 122 increases very slowly by, for example, a tiny amount over the Tx period. Then when the pulses return to minimum width, switch 103 closes (during perhaps several of the minimum pulse widths) and returns the voltage on capacitor 122 back to a desired value.

This feature is especially useful for controlling the pulse widths of a PWM (pulse width monitor) which gives an excellent power factor for a power converter operated from an AC power supply.

In the above descriptions, various aspects of the invention have been described with reference to specific example embodiments. The specification and drawings are accordingly to be regarded in an illustrative rather than in a restrictive sense. It will, however, be evident that various modifications and changes may be made without departing from the broader spirit and scope of the present invention.

By example only, resistor 113 can be replaced with a current source, resistors 111 and 112 also can include an internal impedance of switches 102 and 103, respectively, and may not be literally populated in cases in which a low-impedance discharge path is desired. Moreover, although the above description is described in the context of the period of the pulse train being constant, in other embodiments the period of the pulse train need not be constant since the circuit 201 and/or 301 can work properly with moderate variations. Moreover, one or more additional comparators may be added to circuit 301 by further sub-dividing resistors 115 and 160 to provide output pulses which are even shorter than that of the output U2 of comparator 137. Furthermore, other types of threshold or comparing devices may be used in the above circuits in lieu of the comparators described above, and other types of storage elements besides capacitors may be used in the circuits as well.

In addition, it should be understood that the figures illustrated in the attachments, which highlight the functionality and advantages of the present invention, are presented for example purposes only. The architecture of the example aspect of the present invention is sufficiently flexible and configurable such that it may be utilized (and navigated) in ways other than that shown in the accompanying figures.

Although example aspects of this invention have been described in certain specific embodiments, many additional modifications and variations would be apparent to those skilled in the art. It is therefore to be understood that this invention may be practiced otherwise than as specifically described. Thus, the present example embodiments, again, should be considered in all respects as illustrative and not restrictive.

What is claimed:

1. An electrical circuit, comprising:
   a threshold component arranged to provide an output pulse width based on whether an input to the threshold component exceeds a threshold; and
   a controller arranged to control the threshold of the threshold component, based on at least one input pulse width applied to the electrical circuit, such that the output pulse width of the threshold component tracks the at least one input pulse width applied to the electrical circuit by following or anticipating at least one end of the at least one input pulse width.

2. The electrical circuit of claim 1, wherein the threshold component includes a comparator.

3. The electrical circuit of claim 1, wherein the controller includes a switch.

4. The electrical circuit of claim 1, wherein the controller includes:
   a storage element arranged to store charge upon which the threshold is based; and
   a switch arranged to charge or discharge the storage element based on the at least one input pulse width applied to the electrical circuit.

5. The electrical circuit of claim 4, wherein the controller further includes at least one logic element arranged to control the switch based on the at least one input pulse width applied to the electrical circuit.

6. The electrical circuit of claim 5, wherein the at least one input pulse width is applied to the electrical circuit by another switch.

7. The electrical circuit of claim 1, wherein the output pulse width of the threshold component tracks the at least one input pulse width by following a low-going end of the at least one input pulse width.

8. The electrical circuit of claim 1, wherein the output pulse width of the threshold component tracks the at least one input pulse width by anticipating a low-going end of the at least one input pulse width.

9. An electrical circuit, comprising:
   a threshold component arranged to provide an output pulse width based on whether an input to the threshold component exceeds a threshold;
   a controller arranged to control the threshold of the threshold component, based on at least one input pulse width applied to the electrical circuit, such that the output pulse width of the threshold component tracks the at least one input pulse width applied to the electrical circuit; and
   a further threshold component arranged to provide a further output pulse width based on whether an input to the further threshold component exceeds a further threshold,
   the controller also being arranged to control the further threshold of the further threshold component, based on the at least one input pulse width applied to the electrical circuit, such that the further output pulse width of the further threshold component tracks the at least one input pulse width applied to the electrical circuit.

10. The electrical circuit of claim 9, wherein the further output pulse width of the further threshold component tracks the at least one input pulse width by anticipating a low-going end of the at least one input pulse width.

11. The electrical circuit of claim 4, further comprising at least one voltage divider coupled between a voltage source and the storage element, and arranged to set the threshold based on an amount of charge stored in the storage element.

12. The electrical circuit of claim 1, wherein the at least one input pulse width includes a plurality of varying input pulse widths.

13. The electrical circuit of claim 1, wherein the at least one input pulse width includes a plurality of input pulse widths, and the output pulse width of the threshold component tracks at least one of the input pulse widths having a minimum pulse width.

14. A procedure for tracking at least one applied input pulse width, comprising:
   operating a threshold component that can provide an output based on whether an input to the threshold component exceeds a threshold; and
   controlling the threshold of the threshold component, based on the at least one applied input pulse width, such that the threshold component provides an output that tracks the at least one applied input pulse width by following or anticipating at least one end of the at least one input pulse width.

15. The procedure of claim 14, wherein the threshold component includes a comparator.

16. The procedure of claim 14, further comprising operating a switch to charge or discharge a storage element, the switch being operated based on the at least one applied input pulse width, the storage element arranged to store charge upon which the threshold is based.

17. The procedure of claim 14, wherein the at least one applied input pulse width is provided by another switch.

18. The procedure of claim 14, wherein the output of the threshold component tracks the at least one applied input pulse width by following a low-going end of the at least one input pulse width.

19. The procedure of claim 14, wherein the output of the threshold component tracks the at least one applied input pulse width by anticipating a low-going end of the at least one input pulse width.

20. The procedure of claim 14, wherein the at least one applied input pulse width includes a plurality of varying input pulse widths.

21. The procedure of claim 14, further comprising:
   operating a further threshold component that can provide a further output pulse width based on whether an input to the further threshold component exceeds a further threshold and
   controlling the further threshold of the further threshold component, based on the at least one input pulse width, such that the further output pulse width of the further threshold component tracks the at least one input pulse width.

22. The procedure of claim 21, wherein the further output pulse width of the further threshold component tracks the at least one input pulse width by anticipating a low-going end of the at least one input pulse width.

* * * * *